United States Patent
Nose et al.

(10) Patent No.: US 8,018,295 B2
(45) Date of Patent: Sep. 13, 2011

(54) MODULATION DEVICE AND PULSE WAVE GENERATION DEVICE

(75) Inventors: Koichi Nose, Tokyo (JP); Haruya Ishizaki, Tokyo (JP); Masayuki Mizuno, Tokyo (JP)

(73) Assignee: Nec Corporation, Tokyo (JP)

( * ) Notice: Subject to any disclaimer, the term of this patent is extended or adjusted under 35 U.S.C. 154(b) by 1 day.

(21) Appl. No.: 12/602,869

(22) PCT Filed: Jun. 6, 2008

(86) PCT No.: PCT/JP2008/060463
§ 371 (c)(1),
(2), (4) Date: Dec. 3, 2009

(87) PCT Pub. No.: WO2008/149981
PCT Pub. Date: Dec. 11, 2008

(65) Prior Publication Data
US 2010/0176893 A1  Jul. 15, 2010

(30) Foreign Application Priority Data
Jun. 8, 2007 (JP) ................................. 2007-152723

(51) Int. Cl.
*H03C 3/00* (2006.01)
*H04L 27/12* (2006.01)
*H04L 27/20* (2006.01)

(52) U.S. Cl. ........................................ 332/100; 332/103

(58) Field of Classification Search .......... 332/100–105, 332/117, 144
See application file for complete search history.

(56) References Cited

U.S. PATENT DOCUMENTS
2003/0016762 A1*  1/2003  Martin et al. ................. 375/308
2004/0247027 A1*  12/2004  Wang ............................ 375/239

FOREIGN PATENT DOCUMENTS
| JP | 63-245045 A | 10/1988 |
|---|---|---|
| JP | 5-63746 A | 3/1993 |
| JP | 2002043905 A | 2/2002 |
| JP | 2003179490 A | 6/2003 |
| JP | 2003308133 A | 10/2003 |
| JP | 2004336280 A | 11/2004 |
| JP | 2005057768 A | 3/2005 |
| JP | 2006211208 A | 8/2006 |
| WO | 2006030905 A | 3/2006 |

OTHER PUBLICATIONS
International Search Report for PCT/JP2008/060463 mailed Aug. 12, 2008.

* cited by examiner

*Primary Examiner* — David Mis

(57) ABSTRACT

Provided is a modulation device including a signal selection circuit selecting two carrier signals from a plurality of carrier signals having the same frequency and the same phase difference according to a defined control signal and outputting the selected carrier signals, and a phase interpolator adjusting the phase in smaller units than the phase difference between the plurality of carrier signals according to the control signal and modulating the frequency or the phase of the carrier signal into a baseband signal based on the carrier signals selected by the signal selection circuit to generate a carrier wave signal.

4 Claims, 10 Drawing Sheets

MODULATION DEVICE AND PULSE WAVE GENERATION DEVICE

This application is the National Phase of PCT/JP2008/060463, filed Jun. 6, 2008, which is based upon and claims the priority of Japanese Patent Application No. 2007-152723 on Jun. 8, 2007, the disclosures of which are incorporated herein by reference.

TECHNICAL FIELD

The present invention relates to a modulation device provided in a wireless communication apparatus to modulate a frequency or a phase of a carrier signal according to a baseband signal, and a pulse wave generation device using the same.

BACKGROUND ART

A lot of wireless communication apparatuses use a frequency modulation method or a phase modulation method as a data modulation method. The wireless communication apparatus employing such modulation methods transmits and receives a carrier wave signal generated by increasing or decreasing the frequency of a carrier signal by a fine frequency according to data (baseband signal). Here, the frequency of the carrier signal is referred to as carrier frequency fc and the fine frequency is referred to as modulation frequency $\Delta fc$.

A conventional frequency modulation device having a structure as shown in FIG. 1 has been widely used. The frequency modulation device of FIG. 1 includes carrier signal generator 1 generating a carrier signal, digital-analog converter 2 converting a baseband signal which is a digital signal into an analog signal, bandwidth limiting filter 3 reducing harmonic components contained in the baseband signal output from digital-analog converter 2, and analog mixer 4 mixing the output signal of bandwidth limiting filter 3 with the carrier signal output from carrier signal generator 1, and increasing or decreasing the frequency of the carrier signal by a fine frequency according to the baseband signal to output a carrier wave signal.

The conventional frequency modulation device of FIG. 1 has disadvantages in that the circuit area increases due to bandwidth limiting filter 3, etc. and power consumption increases due to a large stationary current flowing through analog mixer 4.

A method for converting frequency of an input signal without using analog mixer 4 has been disclosed in e.g., International Publication Pamphlet No. 06/030905 (hereinafter, referred to as Patent reference 1). Patent reference 1 suggests a structure for shifting the phase of an input signal in every period using a phase interpolator to convert a frequency of the input signal. FIG. 2 shows a configuration example of the phase interpolator.

As illustrated in FIG. 2, CLK(i) and CLK(i+1) having the same frequency and different phases and a phase modulation control signal (digital signal) output from a control circuit (not shown) are input to phase interpolator 5.

Phase interpolator 5 divides time T equivalent to a phase difference between CLK(i) and CLK(i+1) by b:a(a+b=N) according to set value b input as the phase modulation control signal and outputs a signal delayed from CLK(i) by time (b/N)×T equivalent to set value b.

In detail, when a=4, b=3, the phase of CLK(i) is −135° with respect to a reference clock and the phase of CLK(i+1) is −180° with respect to the reference clock, since phase difference T between CLK(i) and CLK(i+1) is 45°, phase interpolator 5 outputs a signal delayed from CLK(i) by (3/7)×45°, i.e., a signal having a phase of −154°.

FIG. 3 illustrates a configuration example of a conventional frequency conversion device using phase interpolator 5 of FIG. 2. FIG. 3 illustrates the configuration described in above Patent reference 1.

As illustrated in FIG. 3, the conventional frequency conversion device includes m phase generation circuit 10, n phase generation circuit 20, and single phase clock generation circuit 30.

m phase generation circuit 10 outputs m phase clock signals having frequency fc/m and phase differences at equal intervals using a clock signal having frequency fc.

n phase generation circuit 20 includes n phase interpolators 5 shown in FIG. 2 and generates n phase clock signals having the same phase difference from the m phase clock signals generated in m phase generation circuit 10. That is, n phase generation circuit 20 outputs n phase clock signals having a period of (m/fc)×(1/n).

Single phase clock generation circuit 30 synthesizes the n phase clock signals output from n phase generation circuit 20 and outputs a single phase clock signal having a frequency of fc×n/m.

The frequency conversion device of FIG. 3 does not need analog mixer 4 and bandwidth limiting filter 3 shown in FIG. 1. In addition, when n and m are set to satisfy n/m=(fc+Δfc)/fc, a carrier signal having a frequency of fc can be converted into a carrier wave signal having a frequency of fc+Δfc.

In general, the carrier frequency used in the wireless communication apparatus ranges from a few hundred MHz to a few GHz and the modulation frequency used in the wireless communication apparatus ranges from a few ten KHz to a few MHz. Thus, when the frequency conversion device of FIG. 3 is employed in the wireless communication apparatus, if n and in are set to satisfy n/m=(fc+Δfc)/fc, n and m have very large values.

Accordingly, the size of the m phase generation circuit or the n phase generation circuit increases. In particular, the n phase generation circuit needs a lot of phase interpolators. Therefore, the frequency conversion device of FIG. 3 has disadvantages such as large circuit area or high power consumption.

As a result, the wireless communication apparatus, which is sorely in need of miniaturization or low power consumption, may not use the frequency conversion device of FIG. 3 as the frequency modulation device or as the phase modulation device.

SUMMARY

Therefore, an object of the present invention is to provide a modulation device which has features such as small circuit area and low power consumption and which can modulate a frequency or a phase of a carrier signal according to a baseband signal, and a pulse wave generation device having the modulation device.

According to an aspect of the present invention for achieving the above object, there is provided a modulation device for modulating a frequency or a phase of a carrier signal according to a baseband signal, the modulation device including a signal selection circuit selecting two carrier signals from a plurality of carrier signals having the same frequency and the same phase difference according to a defined control signal and outputting the selected carrier signals, a phase interpolator adjusting the phase in smaller units than the phase difference between the plurality of carrier signals according to the control signal and modulating the frequency or the phase of the carrier signal according to the baseband signal based on the carrier signals selected by the signal selection circuit to generate a carrier wave signal, and a phase modulation signal generation circuit generating the control signal to control the signal selection circuit to select the two carrier signals and the phase interpolator to generate the carrier wave signal.

According to another aspect of the present invention, there is provided a pulse wave generation device including an S phase clock converter circuit having S sets of a signal selection circuit and a phase interpolator and outputting S carrier signals having the same frequency and a phase difference of 360°/S, and a duty ratio converter circuit generating S carrier wave signals having different duty ratios in units of 1/S from the S phase carrier signals output from the S phase clock converter circuit.

EXEMPLARY EMBODIMENT

Hereinafter, the present invention will be described with reference to the attached drawings.

First Exemplary Embodiment

Figure 4:
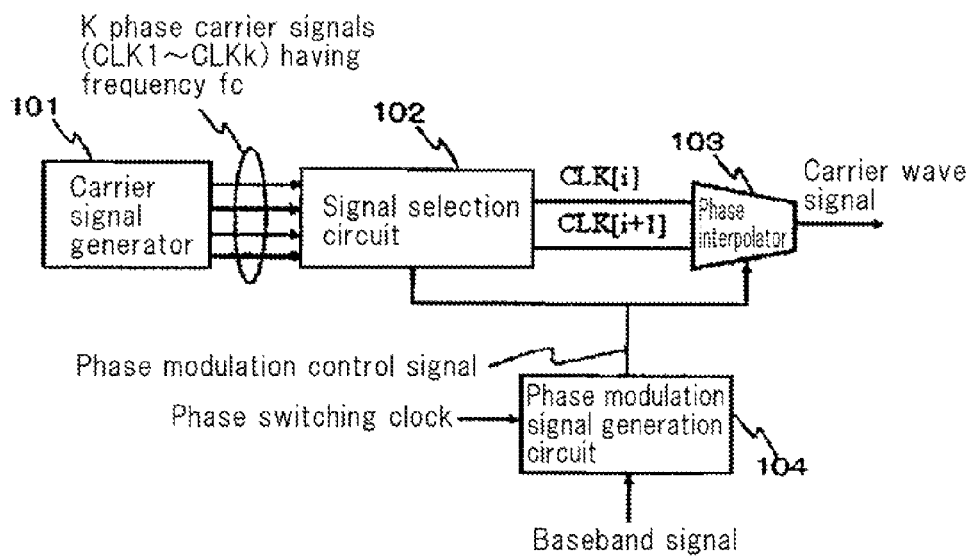
FIG. 4 is a block diagram illustrating the configuration of a modulation device according to a first exemplary embodiment.

FIG. 4 is a block diagram illustrating the configuration of a modulation device according to a first exemplary embodiment.

The modulation device according to the first exemplary embodiment includes carrier signal generator 101 generating k carrier signals CLK1~CLKk having the same frequency fc and different phases, signal selection circuit 102 selecting two carrier signals CLK[i] and CLK[i+1] from carrier signals CLK1~CLKk according to a phase modulation control signal (digital signal) and outputting selected carrier signals CLK[i] and CLK[i+1], phase interpolator 103 adjusting the phase in smaller units than the phase difference between respective carrier signals CLK1~CLKk according to the phase modulation control signal and modulating the frequency or the phase of the carrier signal according to a baseband signal based on carrier signals CLK[i] and CLK[i+1] selected by signal selection circuit 102 to generate a carrier wave signal, and phase modulation signal generation circuit 104 generating the phase modulation control signal to control signal selection circuit 102 to select two carrier signals CLK[i] and CLK[i+1] and phase interpolator 103 to generate the carrier wave signal.

As illustrated in FIG. 4, the baseband signal and a phase switching clock are input to phase modulation signal generation circuit 104. In this exemplary embodiment, a clock having the same frequency as carrier signals CLK1~CLKk is used as the phase switching clock.

Phase modulation signal generation circuit 104 switches the phase modulation control signal in synchronization with the phase switching clock, thus switching the phase of the carrier wave signal in every period. More specifically, phase modulation signal generation circuit 104 outputs the phase modulation control signal corresponding to the baseband signal at the rising timing of the phase switching clock, thereby switching the phase of the carrier wave signal output from phase interpolator 103 in every rising timing of the phase switching clock.

Figure 5:
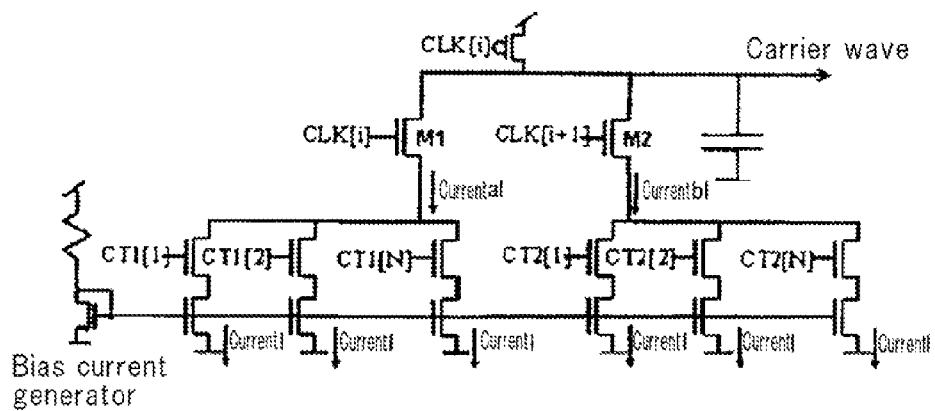
FIG. 5 is a circuit diagram illustrating a configuration example of a phase interpolator of FIG. 4.

FIG. 5 is a circuit diagram illustrating a configuration example of the phase interpolator of FIG. 4.

As illustrated in FIG. 5, phase interpolator 103 may be implemented with the combination of a well-known dynamic circuit and a constant current source circuit. The detailed configuration of the phase interpolator has been described in above Patent reference 1.

Phase interpolator 103 of FIG. 5 sets 'a' control signals to a high level among N-bit control signals CT1[1], CT1[2], . . . , CT1[N], and thus can set a value of current flowing through transistor M1 to aI when carrier signal CLK[i] has a high level.

Moreover, phase interpolator 103 of FIG. 5 sets b control signals to a high level among N-bit control signals CT2[1], CT2[2], CT2[N], and thus can set a value of current flowing through transistor M2 to bI when carrier signal CLK[i+1] has a high level.

Meanwhile, I indicates a current flowing through each constant current source circuit.

Figure 6:
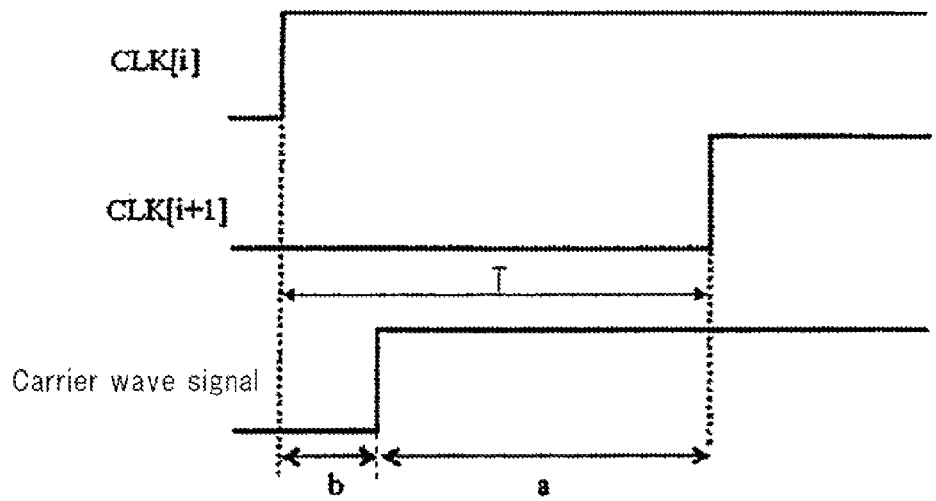
FIG. 6 is a timing diagram illustrating an operation example of the phase interpolator of FIG. 5.

Here, the phase of carrier signal CLK[i] is delayed by a delay value determined by a ratio of value aI of the current flowing through transistor M1 to value bI of the current flowing through transistor M2. That is, as illustrated in FIG. 6, when time T equivalent to the phase difference between carrier signals CLK[i] and CLK[i+1] is divided by b:a(a+b=N), phase interpolator 103 outputs a signal (carrier wave signal) delayed from carrier signal CLK[i] by the time (b/N: a+b=N)×T equivalent to b.

Control signals CT1[1]~CT1[N] and CT2[1]~CT2[N] may be generated using a logic circuit or the like based on the phase modulation control signal output from phase modulation signal generation circuit 104. Alternatively, control signals CT1[1]~CT1[N] and CT2[1]~CT2[N] may be the phase modulation control signals output from phase modulation signal generation circuit 104.

Carrier signal generator 101 may be implemented with, e.g., a flip-flop which frequency-divides a clock signal having a higher frequency than carrier signals CLK1~CLKk. In addition, signal selection circuit 102 and phase modulation signal generation circuit 104 may be implemented with the combination of a well-known logic circuit, a selector, etc.

Figure 7:
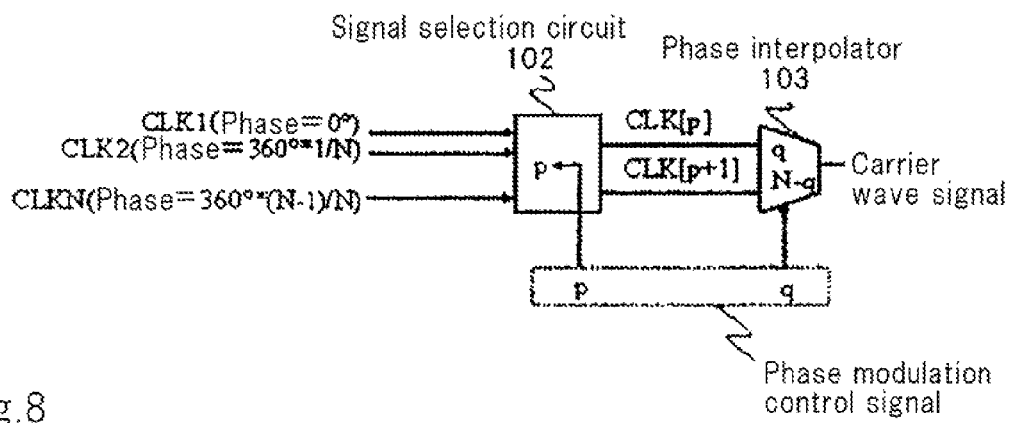
FIG. 7 is a block diagram illustrating a setting example of phase modulation control signals supplied to a signal selection circuit and the phase interpolator of FIG. 4.
Figure 8:
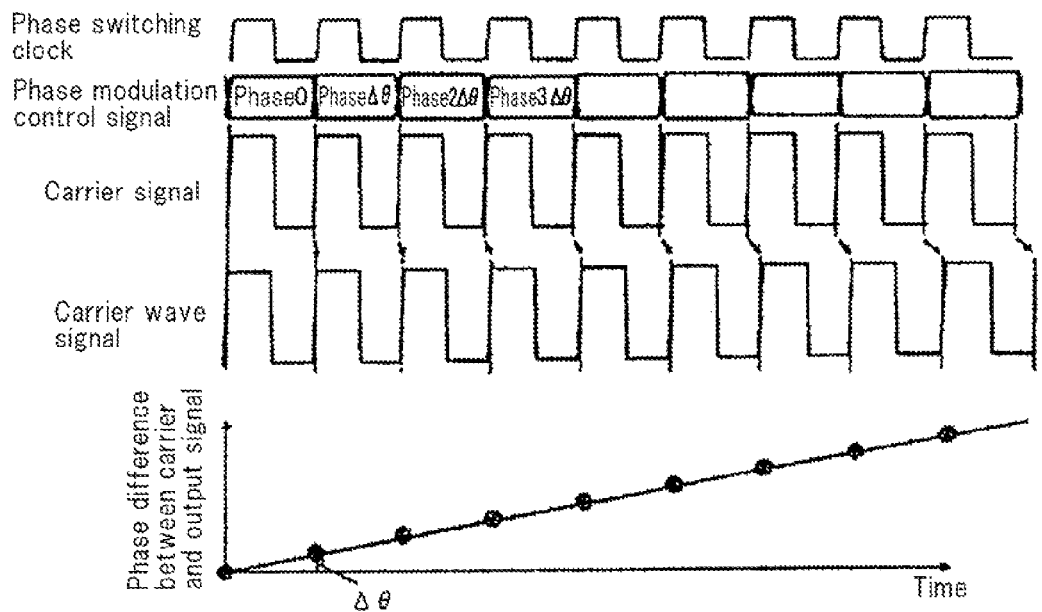
FIG. 8 is a timing diagram illustrating a detailed operation example of the signal selection circuit and the phase interpolator of FIG. 4.

FIG. 7 is a block diagram illustrating a setting example of phase modulation control signals supplied to the signal selection circuit and the phase interpolator of FIG. 4, and FIG. 8 is a timing diagram illustrating a detailed operation example of the signal selection circuit and the phase interpolator of FIG. 4.

As illustrated in FIG. 7, carrier signal CLK1 (phase=0°), carrier signal CLK2 (phase=360°×1/N) and carrier signal CLKN (phase=360°×(N−1)/N) are input to signal selection circuit 102.

Signal selection circuit 102 selects two carrier signals CLK[p] and CLK[p+1] from carrier signals CLK1~CLKN according to phase modulation control signal p output from phase modulation signal generation circuit 104 and outputs selected carrier signals CLK[p] and CLK[p+1]. For example, when phase modulation control signal p is '1', signal selection circuit 102 outputs carrier signal CLK1 through a first output terminal and carrier signal CLK2 through a second output terminal. In addition, when phase modulation control signal p is '2', signal selection circuit 102 outputs carrier signal CLK2 through the first output terminal and carrier signal CLK3 through the second output terminal. Moreover, when phase modulation control signal p is '3', signal selection circuit 102 outputs carrier signal CLK3 through the first output terminal and carrier signal CLK4 through the second output terminal. Likewise, when phase modulation control signal p is 'k', signal selection circuit 102 outputs carrier signal CLKk through the first output terminal and carrier signal CLKk+1 through the second output terminal.

Here, when it is assumed that the phase modulation control signal input to signal selection circuit 102 is p and when the phase modulation control signal input to phase interpolator 103 is q, the phase of the carrier wave signal output from phase interpolator 103 upon the input of carrier signal CLK1 is expressed as 360°/k×(p+q/N).

The phase resolution, which is a minimum delay value controllable by the phase modulation control signal, is 360°/(k×N). Phase interpolator 103 outputs carrier wave signals having different phases in units of 360°/(k×N) within the range of 0° to 360°.

In general, a wireless communication apparatus mostly adopts a phase modulation method, in which, when a baseband signal (data) has a value of '1', a phase of a carrier wave signal increases at a fixed ratio in every period of a carrier signal and reaches a phase (e.g., +90° equivalent to data '1' after defined periods, and when the baseband signal has a value of '0', the phase of the carrier wave signal decreases at a fixed ratio in every period of the carrier signal and reaches a phase (e.g., −90° equivalent to data '0' after defined periods.

The reason for this is to smoothly change the phase of the carrier wave signal to the phase corresponding to data '1' or '0' in plural periods because switching the phase of the carrier wave signal to +90° or −90° in units of one period increases spurious noise components unnecessary for the wireless communication.

In this exemplary embodiment, phase modulation signal generation circuit 104 of FIG. 4 is operated by the phase switching clock having the same frequency as the carrier signal, such that the phase of the carrier wave signal increases or decreases in units of Δθ in every rising of the carrier signal and reaches the phase corresponding to the value of the baseband signal after the plural periods.

As described above, the frequency of the carrier wave signal increases or decreases from frequency fc of the carrier signal by Δfc. Here, the fact that the frequency increases from fc to fc+Δfc indicates that the period becomes (fc/(fc+Δfc)) times. When the frequency becomes fc+Δfc, the period is shortened to 360°×(1−fc/(fc+Δfc))=360°×Δfc/(fc+Δfc).

Figure 9:
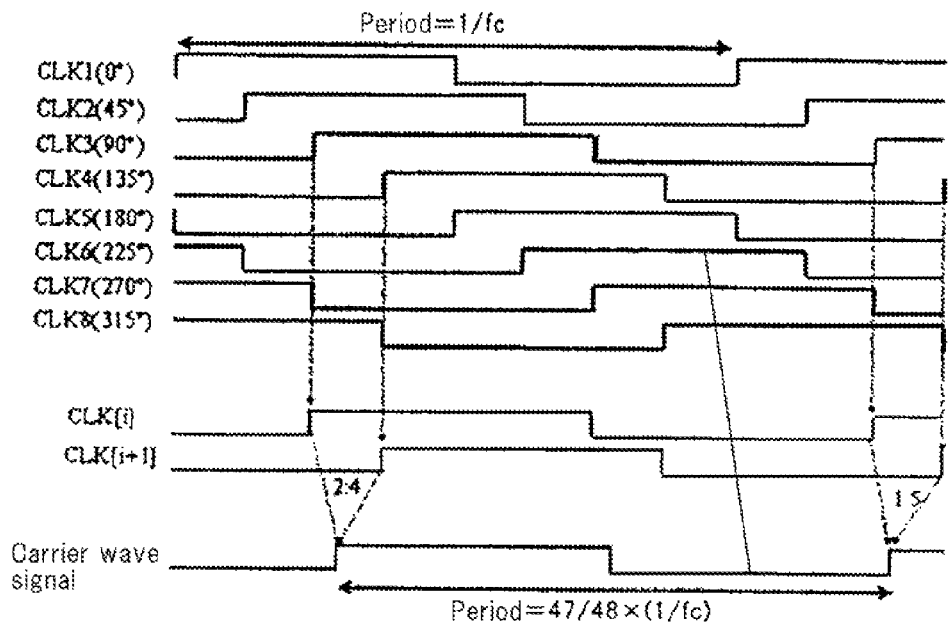
FIG. 9 is a timing diagram illustrating a phase modulation operation example of the modulation device according to the first exemplary embodiment.

Therefore, when k and N are set such that phase value Δθ=360°×Δfc/(fc+Δfc) of the carrier wave signal with respect to the carrier signal is an integer multiple of 360°/(k×N), the frequency of the carrier signal can be increased to fc+Δfc or decreased to fc−Δfc. That is, the modulation device of FIG. 4 may be used as the frequency modulation device. In addition, when the frequency of the carrier signal increases or decreases in units of Mc and reaches a target phase after a defined number of periods, the modulation device of FIG. 4 may be used as the phase modulation device. FIG. 9 illustrates a phase modulation operation example when it is assumed that k=8 and N=6.

Figure 1:
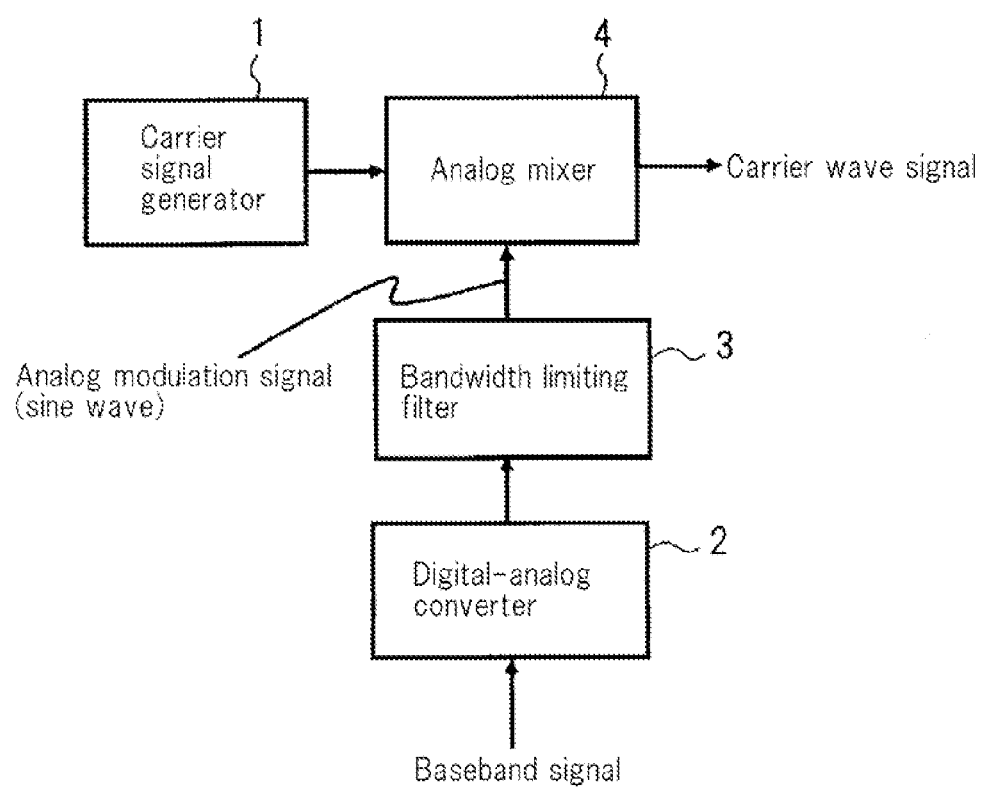
FIG. 1 is a block diagram illustrating a configuration example of a conventional frequency modulation device.
Figure 2:
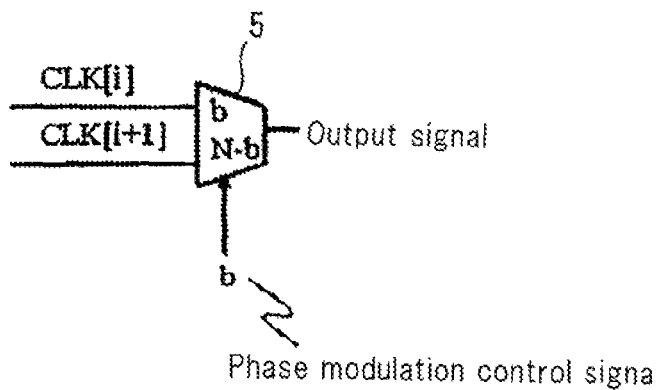
FIG. 2 is a schematic diagram illustrating the configuration and operation of a phase interpolator.
Figure 2:
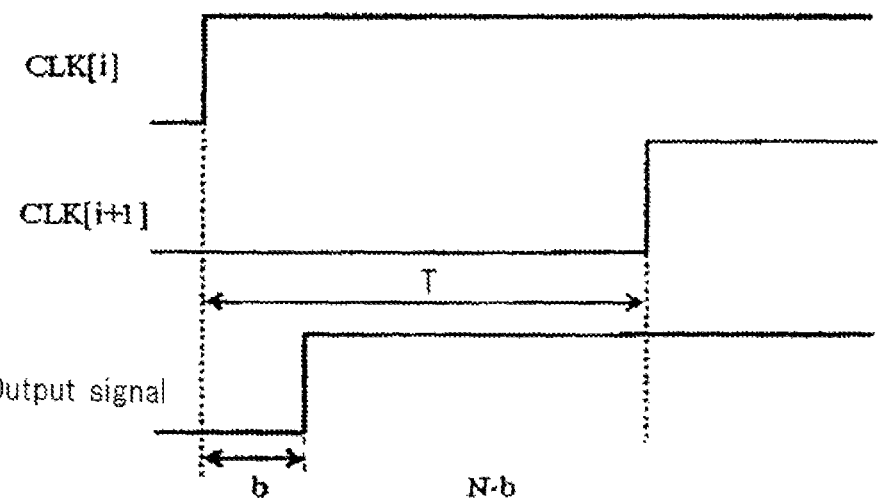
Figure 3:
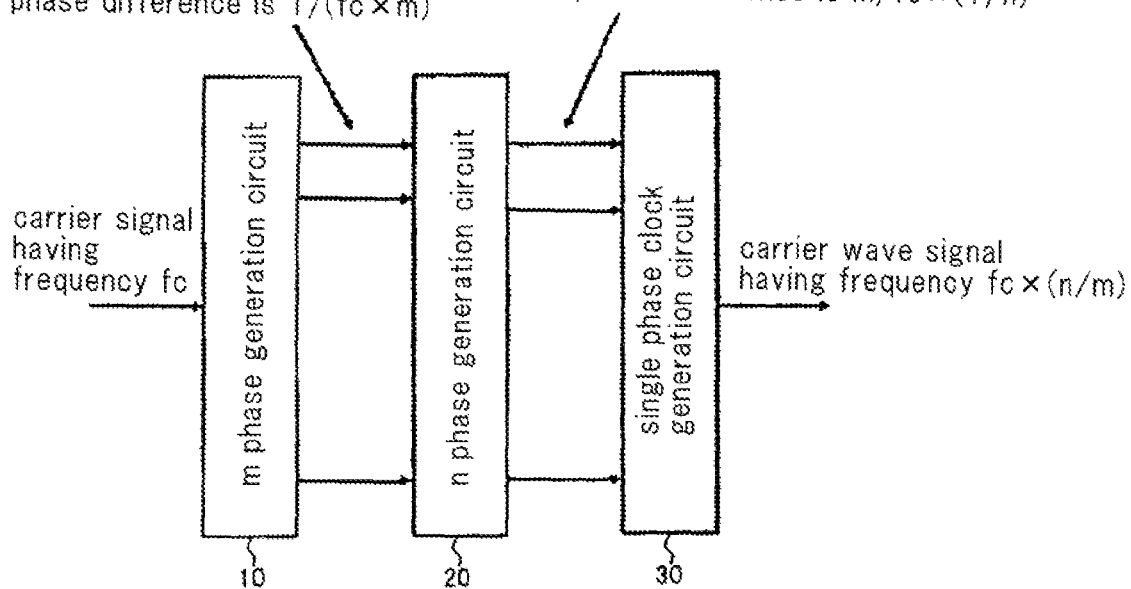
FIG. 3 is a block diagram illustrating a configuration example of a conventional frequency conversion device.

In the conventional frequency conversion device of FIG. 2, the n phase generation circuit needs n phase interpolators such that the carrier frequency becomes n/m times. Meanwhile, since the modulation device of this exemplary embodiment is implemented with one phase interpolator 103 and one signal selection circuit 102 in which the switching step number is N, the circuit area of the frequency modulation device or the phase modulation device can be reduced. Moreover, since the modulation device of this exemplary embodiment uses fewer phase interpolators 103 than the conventional frequency conversion device of FIG. 2, it consumes less power.

Second Exemplary Embodiment

A modulation device according to a second exemplary embodiment is different from the modulation device according to the first exemplary embodiment in that a period of a phase switching clock is set to R times a period of a carrier signal (a frequency is 1/R times) and in that a phase change value caused by phase interpolator 103 is increased more than that of the first exemplary embodiment by R times (R×Δθ). Apart from this, the modulation device according to the second exemplary embodiment is the same as the modulation device according to the first exemplary embodiment, and thus detailed explanations thereof are omitted.

Figure 10:
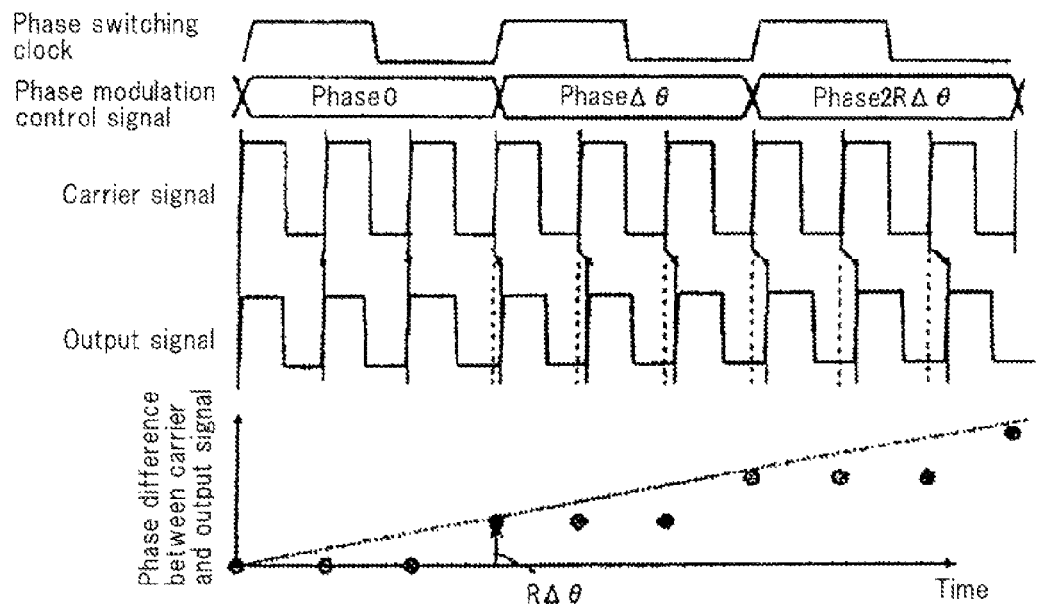
FIG. 10 is a timing diagram illustrating a detailed operation example of a modulation device according to a second exemplary embodiment.

As described above, although the period of the phase switching clock supplied to phase modulation signal generation circuit 104 is set to R times the period of the carrier signal and the phase change value caused by phase interpolator 103 is increased more than that of the first exemplary embodiment by R times (R×Δθ), as illustrated in FIG. 10, the phase change value obtained in every R period of the carrier signal is the same as when the phase is changed by Δθ in every period of the carrier signal shown in FIG. 8. Therefore, similarly to the modulation device according to the first exemplary embodiment, the modulation device according to the second exemplary embodiment may be implemented as a phase modulation device or a frequency modulation device.

Meanwhile, when the modulation device according to the second exemplary embodiment is used in a wireless communication apparatus, frequency components (fc×(1/R) components) of the phase switching clock may be leaked to the carrier wave signal. For example, the frequency components of the phase switching clock may be output from a power amplifier for transmission. In this case, it is necessary to set a value of R to satisfy the standard of the wireless communication apparatus using the modulation device of this exemplary embodiment (e.g., limiting the power strength except for predetermined frequency components to below −20 dBm-40 dBm).

Figure 11:
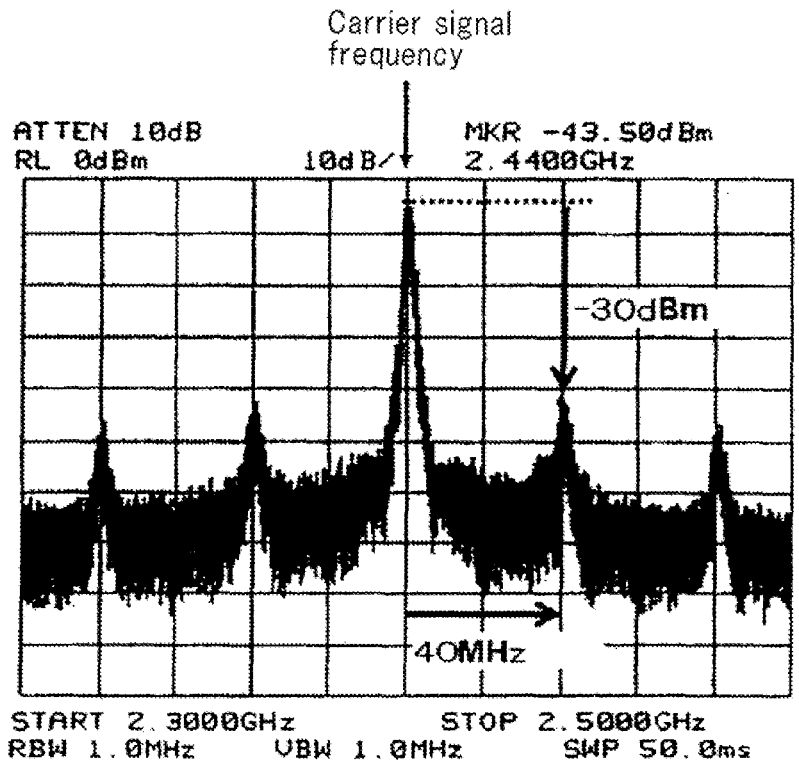
FIG. 11 is a graph illustrating an example of power spectrum characteristics of a carrier wave signal output from the modulation device according to the second exemplary embodiment.

FIG. 11 illustrates an example of power spectrum characteristics of the carrier wave signal output from the modulation device according to the second exemplary embodiment. FIG. 11 illustrates the example of power spectrum characteristics of the carrier wave signal when the carrier frequency is set to 2.4 [GHz] and when the frequency of the phase switching clock is set to 40 [MHz], i.e., R=60.

As illustrated in FIG. 11, in the case of the carrier wave signal output from the modulation device according to the second exemplary embodiment, the peak of the power spectrum exists in a frequency that is different from the carrier frequency by 40 [MHz] except for the power spectrum in the frequency of the carrier signal.

However, according to the power spectrum characteristics of FIG. 11, the strength of the power spectrum of the frequency that is different from the carrier frequency by 40 [MHz] should have a limit that is limited lower than the power spectrum of the carrier frequency by more than 30 [dB]. Therefore, a wireless communication apparatus pursuant to the wireless standard such as Zigbee, which places fewer restrictions on the strength of the power spectrum other than the carrier frequency, may use the modulation device according to the second exemplary embodiment without any problem. Meanwhile, it is prescribed in Zigbee that the strength of the power spectrum other than the carrier frequency should be set lower than the strength of the power spectrum of the carrier frequency by 20 dB. As such, there is a margin over 10 dB using the modulation device according to the second exemplary embodiment.

A wireless communication apparatus, in which the strength of the power spectrum other than the carrier frequency should have a limit that is lower than the strength of the power spectrum of the carrier frequency by more than 30 dB, can reduce an unnecessary peak of the power spectrum by, for example, spectrum-spreading a phase modulation control signal output from phase modulation signal generation circuit 104 by ΔΣ modulation, etc.

In addition, when the peak other than the carrier frequency is a frequency sufficiently that is different from a frequency of an adjacent channel, since the limitation on the strength of the power spectrum is less strict, there may be used a method for decreasing the value of R such that the peak of the power spectrum except for the carrier frequency is different from the carrier frequency.

According to the modulation device of this exemplary embodiment, the frequency of the phase switching clock is set to 1/R times the carrier frequency, thus decreasing the operating frequency of phase modulation signal generation circuit 104. As a result, the design of the phase modulation signal generation circuit can be simplified and power consumption thereof can be reduced.

Moreover, while k and N values need to be set to switch the phase in units of Δθ in the modulation device according to the first exemplary embodiment, k and N values are set to switch the phase in units of R×Δθ in the modulation device according to the second exemplary embodiment, such that the number N of constant current source circuits provided in phase interpolator 103 of FIG. 5 can be reduced into 1/R. As such, the modulation device according to the second exemplary embodiment can reduce the circuit area of phase interpolator 103 more than the modulation device according to the first exemplary embodiment. Further, since the number of the constant current source circuits decreases, the modulation device according to the second exemplary embodiment can reduce power consumption more than the modulation device according to the first exemplary embodiment.

In the modulation devices according to the first and second exemplary embodiments, the minimum period of the carrier wave signal is 1/fc but the average period is 1/(fc+Δfc). Therefore, the modulation devices according to the first and second exemplary embodiments are effectively used in the field in which the frequency spectrum determined by the average period strength is given more weight than the logic circuit design with the performance determined by the minimum period, and specifically, used as phase modulation devices or frequency modulation devices of the wireless communication apparatus.

Third Exemplary Embodiment

A modulation device according to a third exemplary embodiment is applied to a phase modulation method which changes a phase of a carrier wave signal from 360°×pa to 360°×pb with respect to a phase of a carrier signal, corresponding to a baseband signal having a period which is k times the period of the carrier signal.

In this case, a period of a phase switching clock is set to Ni times the period of the carrier signal (i is an integer from 1 to m, and N1, N2, ..., Nm are an arbitrary integer combination wherein N1+N2+...+Nm=k). That is, the modulation device according to the third exemplary embodiment is different from the modulation devices according to the first and second exemplary embodiments in that the period of the phase switching clock supplied to phase modulation signal generation circuit 104 is not limited to a fixed value and in that a phase change value caused by phase interpolator 103 is not limited to a fixed value. The phase change value caused by phase interpolator 103 may be set such that a phase difference that is to be switched in every Ni periods of the carrier wave signal becomes 360°×Ti (Ti is an arbitrary combination wherein T1+T2+...+Tm=pb-pa). Apart from this, the modulation device according to the third exemplary embodiment is the same as the modulation device according to the first exemplary embodiment, and thus detailed explanations thereof are omitted.

Figure 12:
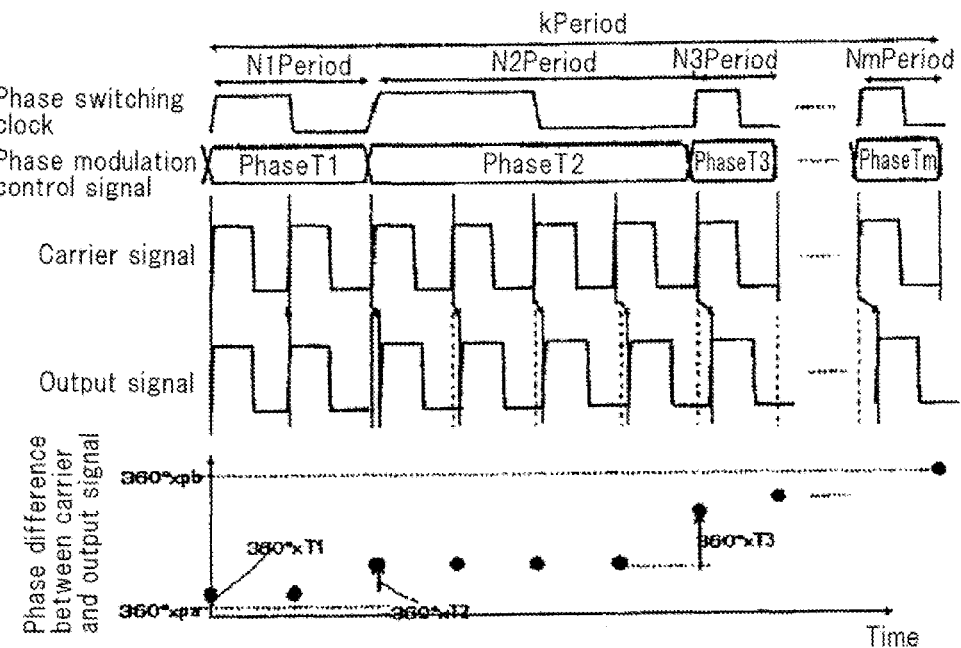
FIG. 12 is a timing diagram illustrating a detailed operation example of a modulation device according to a third exemplary embodiment.

Although the period of the phase switching clock supplied to phase modulation signal generation circuit 104 is set to Ni times the period of the carrier signal and the phase change value caused by phase interpolator 103 is set to 360°×Ti, as illustrated in FIG. 12, the phase of the carrier wave signal obtained after k periods of the carrier signal can be changed from 360°×pa to 360°×pb. Accordingly, similarly to the modulation devices according to the first and second exemplary embodiments, the modulation device according to the third exemplary embodiment may be implemented as a phase modulation device or a frequency modulation device.

Since the modulation device according to the third exemplary embodiment does not control the phase switching clock or the phase change value caused by phase interpolator 103 to a fixed value, it thereby reduces a peak value of the power spectrum of the frequency other than the carrier frequency.

Fourth Exemplary Embodiment

Figure 13:
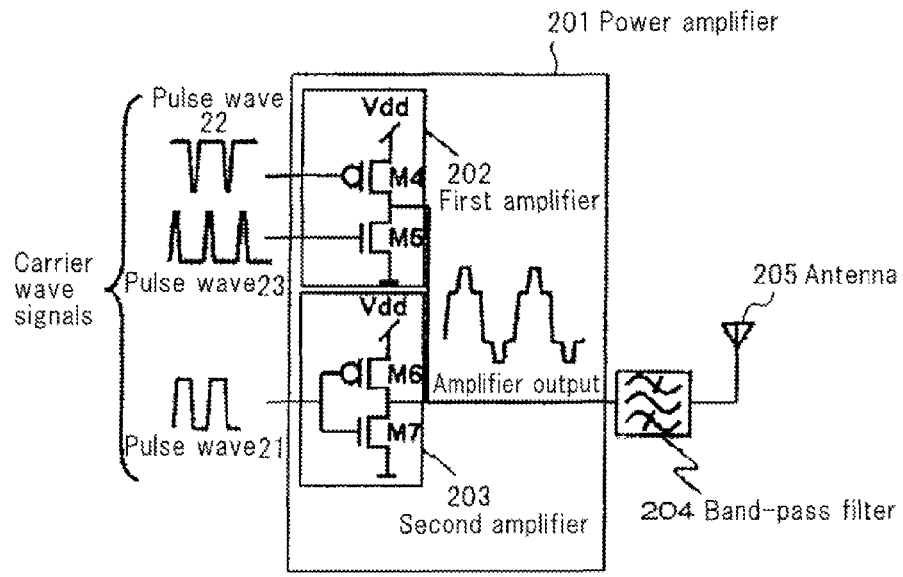
FIG. 13 is a circuit diagram illustrating a configuration example of a power amplifier.

As illustrated in FIG. 13, Japanese Patent Application No. 2006-250123 filed for registration by the present applicants prior to the present application suggests a configuration synthesizing a plurality of carrier wave signals having the same frequency, different ratios (duty ratios) of a high level time to a low level time of a signal voltage, and different phases, thereby restricting harmonic components of the carrier wave signal output from a power amplifier for transmission.

A fourth exemplary embodiment provides a configuration example of a pulse generation device including an S phase clock converter circuit having S sets of the signal selection circuit and the phase interpolator described in the first to third exemplary embodiments and outputting S carrier signals having a phase difference of 360°/S, and a duty ratio converter circuit generating S carrier wave signals (pulse waves 21-23) having different duty ratios in units of 1/S from the S phase carrier signals output from the S phase clock converter circuit.

Figure 14:
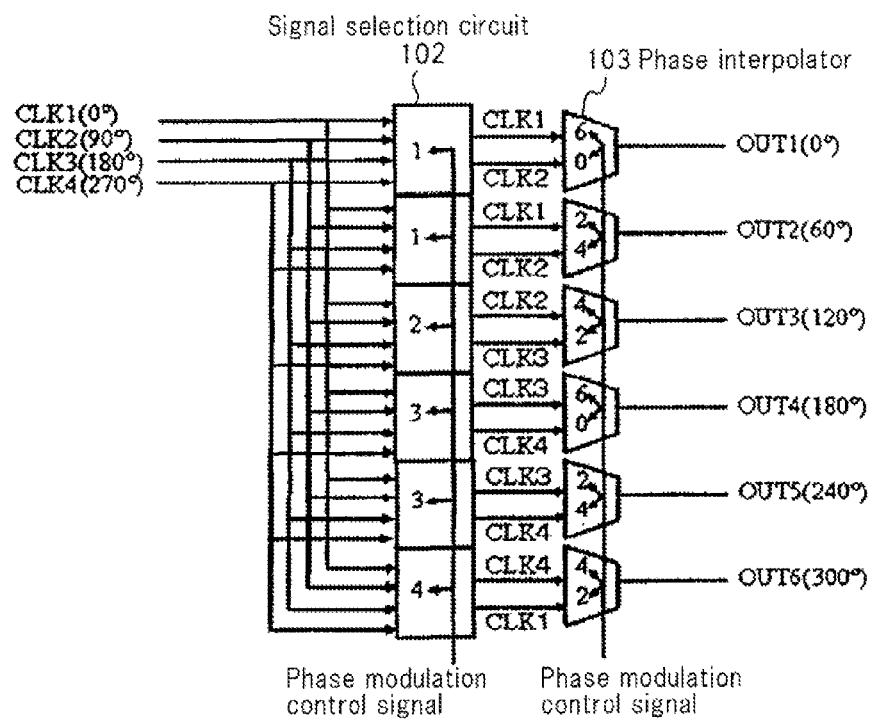
FIG. 14 is a block diagram illustrating a configuration example of an S phase clock converter circuit including signal selection circuit and phase interpolator.

As illustrated in FIG. 14; the S phase clock converter circuit includes S sets (6 sets in FIG. 14) of signal selection circuit 102 and phase interpolator 103 described in the first exemplary embodiment. Phase modulation signal generation circuit 104 provides appropriate values to signal selection circuits 102 and phase interpolators 103 as phase modulation control signals, thus generating the S phase signals having the phase difference of 360°/S. For example, the phase modulation control signals supplied to signal selection circuits 102 and phase interpolators 103 are set to values shown in FIG. 14 such that 6 phase signals having phases of 0°, 60°, 120°, 180°, 240° and 300° are generated from 4 phase signals having phases of 0°, 90°, 180° and 270°.

The numerical values shown in signal selection circuits 102 and phase interpolators 103 of FIG. 14 indicate the values of the phase modulation control signals supplied from phase modulation signal generation circuit 104. The numerical values in signal selection circuits 102 are equivalent to p of FIG. 7, the upper numerical values in phase interpolators 103 are equivalent to q of FIG. 7, and the lower numerical values in phase interpolators 103 are equivalent to N-q of FIG. 7.

Figure 15:
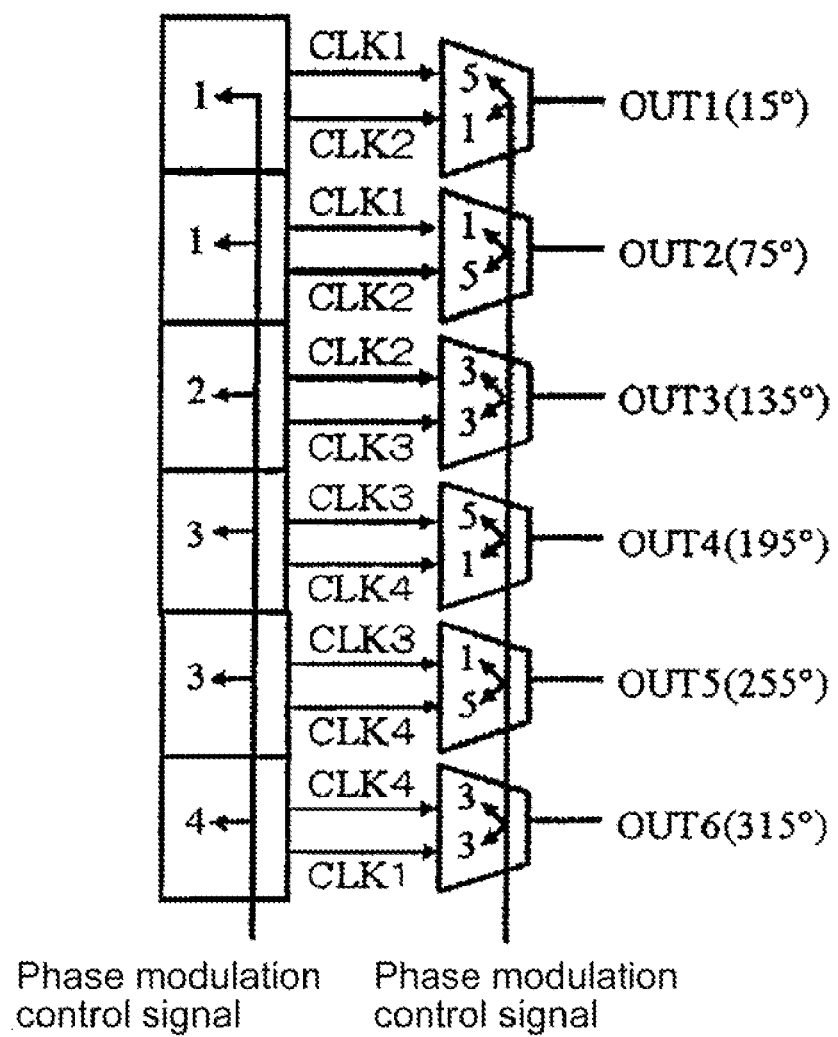
FIG. 15 is a block diagram illustrating one configuration example of a modulation device according to a fourth exemplary embodiment.
Figure 16:
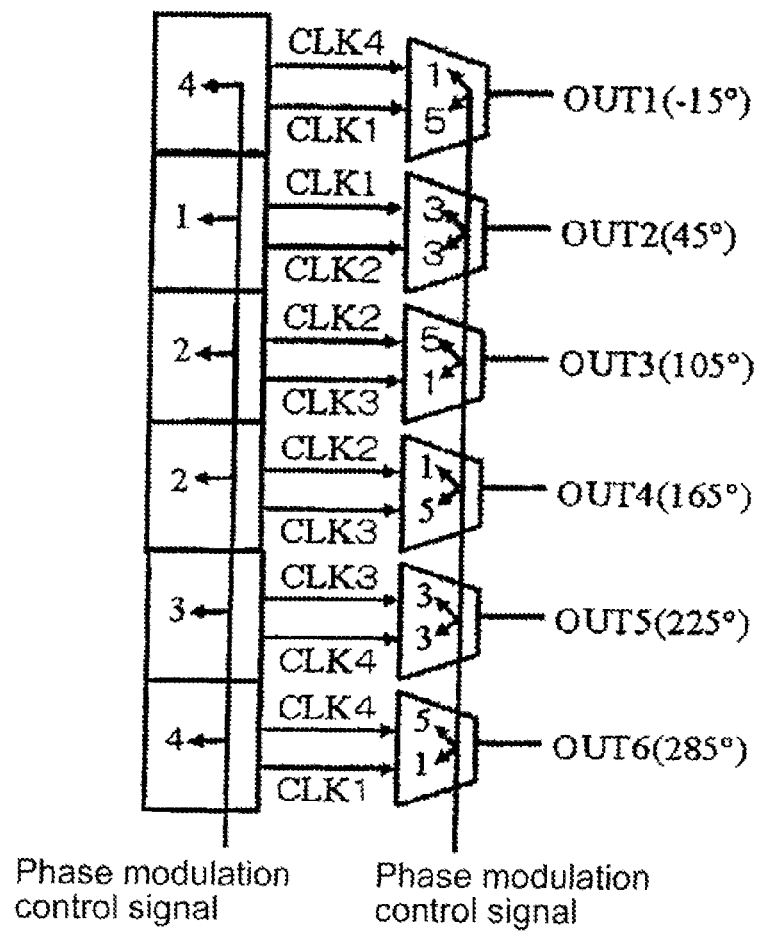
FIG. 16 is a block diagram illustrating another configuration example of the modulation device according to the fourth exemplary embodiment.

Meanwhile, as explained in the first and second exemplary embodiments, the S phase clock converter circuit of FIG. 14 can modulate the phases of the entire 6 phase output signals. FIG. 15 illustrates the combination of the phase modulation signals when the phases of the entire 6 phase output signals are faster by +15°. In addition, FIG. 16 illustrates the combination of the phase modulation signals when the phases of the entire 6 phase output signals are slower by −15°. In either FIG. 15 or FIG. 16, the phase difference between the respective output signals is maintained as 60°. As described above, the phase modulation control signals are appropriately set to maintain the phase difference between the S phase output signals and modulate the phases of the entire S phase clock signals.

Figure 17:
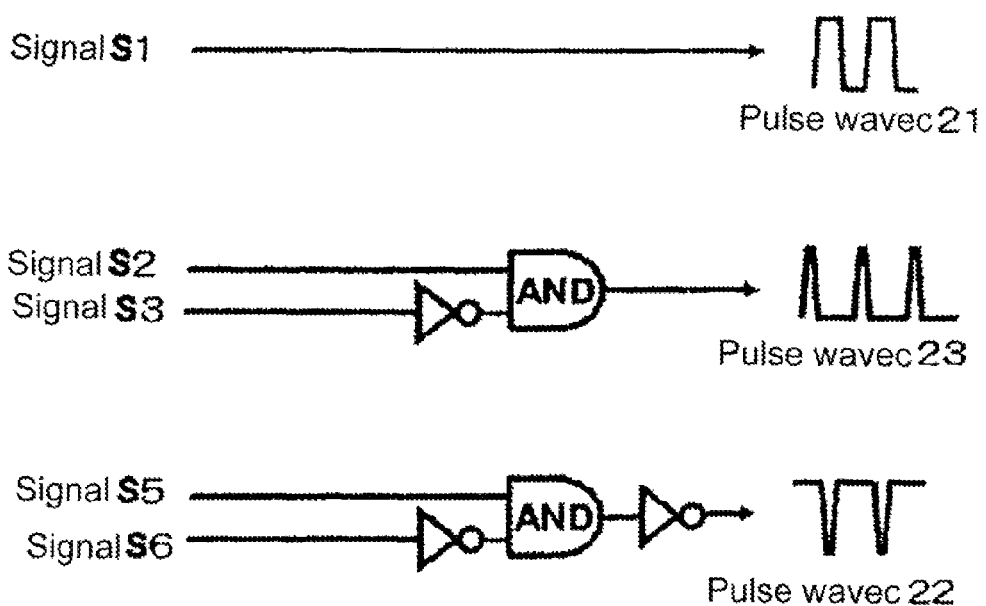
FIG. 17 is a circuit diagram illustrating a configuration example of a duty converter circuit generating a pulse wave supplied to the power amplifier of FIG. 13.

The duty converter circuit which generates pulse waves 21-23 having different duty ratios and supplied to the power amplifier of FIG. 13 may be implemented with a logic circuit as shown in FIG. 17. The S phase clock signals generated in the S phase clock converter circuit are supplied to the duty converter circuit.

Figure 18:
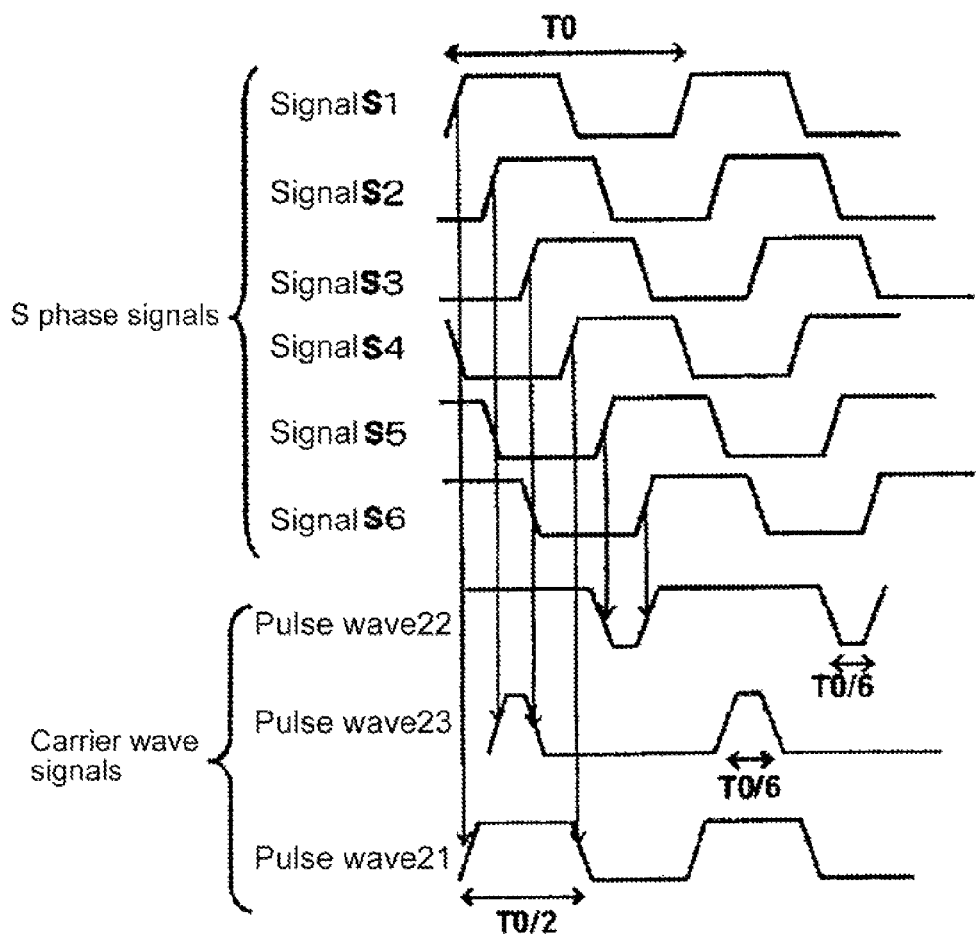
FIG. 18 is a timing diagram illustrating the operation of the duty converter circuit of FIG. 17.

FIG. 18 is a timing diagram illustrating an operation example of the duty converter circuit of FIG. 17. FIG. 18 illustrates the operation example upon input of 6 phase clock signals S1~S6 generated in the S phase clock converter circuit of FIG. 14.

As illustrated in FIG. 18, it is assumed that first signal S1 is pulse wave 21 having a duty ratio of 50%. A high level time of pulse wave 21 is 0~(1/2)×T0.

When second signal S2 and third signal S3 are input to the logic circuit of FIG. 17, a signal of pulse wave 23 (duty ratio is 100×(1/6) %) shown in FIG. 18 is output. A high level time of this waveform is (1/6)×T0~(2/6)×T0.

Moreover, when fifth signal S5 and sixth signal S6 are input to the logic circuit of FIG. 17, a signal of pulse wave 22 (duty ratio is 100×(5/6) %) shown in FIG. 18 is output. A low level time of this waveform is (4/6)×T0~(5/6)×T0.

Pulse waves 22 and 23 output from the duty converter circuit are amplified in first amplifier 202 provided in power amplifier 201 of FIG. 13, and pulse wave 21 output from the duty converter circuit is amplified in second amplifier 203 provided in power amplifier 201 of FIG. 13. Power amplifier (power amplifier) 201 outputs a synthetic signal of the output signals of first amplifier 202 and second amplifier 203.

The signal output from power amplifier 201 is emitted through antenna 205 with unnecessary frequency components removed therefrom by band-pass filter 204.

According to this exemplary embodiment, since the carrier signals are converted into the plurality of carrier wave signals using the S phase interpolators, it is possible to obtain the pulse waveforms through a configuration simpler than the configuration disposing a duty adjustment circuit after the generation of the carrier wave signal as disclosed in Japanese Patent Application No. 2006-250123. As a result, the circuit area and the power consumption of the pulse wave generation device are reduced.

The invention claimed is:
1. A modulation device for modulating a frequency or a phase of a carrier signal according to a baseband signal, the modulation device comprising:
  a signal selection circuit selecting two carrier signals from a plurality of carrier signals having the same frequency according to a defined control signal and outputting the selected carrier signals;
  a phase interpolator adjusting the phase in smaller units than a phase difference between the plurality of carrier signals according to the control signal and modulating the frequency or the phase of the carrier signal according to the baseband signal based on the carrier signals selected by the signal selection circuit to generate a carrier wave signal; and
  a phase modulation signal generation circuit generating the control signal that is to control the signal selection circuit to select the two carrier signals and the phase interpolator to generate the carrier wave signal,
  wherein the plurality of carrier signals have the same phase difference, and
  wherein, when i is an integer from 1 to m, N1, N2, ..., Nm are an arbitrary integer combination, wherein N1 + N2+ ... +Nm=k, and Ti is an arbitrary combination, wherein T1+T2+ ... Tm=pb−pa, the phase modulation signal generation circuit switches the control signal corresponding to the baseband signal having a period k times the period of the carrier signal in synchronization with a phase switching clock in which the carrier signal rises at every Ni times,
   wherein, when the phase of the carrier wave signal is changed from 360°×pa to 360°×pb with respect to the phase of the carrier signal according to the baseband signal, a phase difference that is to be switched in every Ni period of the carrier wave signal is 360°×Ti.

2. The modulation device according to claim 1, wherein the phase modulation signal generation circuit switches the control signal corresponding to the baseband signal in synchronization with a phase switching clock which is the same frequency as the carrier signal to switch the phase of the carrier wave signal in every period,
   wherein, when the frequency of the carrier signal is fc and the modulation frequency is Δfc, a phase change value that is to be switched in every period of the carrier wave signal is 360°×Δfc/(fc+Δfc).

3. The modulation device according to claim 1, wherein the phase modulation signal generation circuit switches the control signal corresponding to the baseband signal in synchronization with a phase switching clock which is a frequency 1/R times the frequency of the carrier signal to switch the phase of the carrier wave signal in every R period,
   wherein, when the frequency of the carrier signal is fc and the modulation frequency is Δfc, a phase change value that is to be switched in every R period of the carrier wave signal is R×360°×Δfc/(fc+Δfc).

4. A pulse wave generation device comprising:
   an S phase clock converter circuit including S sets of a signal selection circuit and a phase interpolator, as recited in claim 1, and outputting S carrier signals having the same frequency and a phase difference of 360°/S; and
   a duty ratio converter circuit generating S carrier wave signals having different duty ratios in units of 1/S from the S phase carrier signals output from the S phase clock converter circuit.

* * * * *